US006463000B2

(12) United States Patent
Lee et al.

(10) Patent No.: US 6,463,000 B2
(45) Date of Patent: Oct. 8, 2002

(54) FIRST-IN FIRST-OUT MEMORY DEVICE AND METHOD OF GENERATING FLAG SIGNAL IN THE SAME

(75) Inventors: Young Ju Lee, Goyang; Jeung Joo Lim, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/950,263

(22) Filed: Sep. 10, 2001

(65) Prior Publication Data

US 2002/0080672 A1 Jun. 27, 2002

(30) Foreign Application Priority Data

Dec. 26, 2000 (KR) ........................................ 2000-82094

(51) Int. Cl.[7] .............................................. G11C 7/00
(52) U.S. Cl. ............. 365/221; 365/230.05; 365/189.12; 365/240; 365/189.07
(58) Field of Search ........................... 365/221, 230.05, 365/189.01, 230.06, 189.12, 240, 189.07, 78

(56) References Cited

U.S. PATENT DOCUMENTS

| | | | | |
|---|---|---|---|---|
| 3,601,809 A | * | 8/1971 | Gray et al. ............... 340/172.5 |
| 4,823,321 A | * | 4/1989 | Aoyama ................. 365/189.05 |
| 4,829,475 A | * | 5/1989 | Ward et al. .................... 365/78 |
| 4,888,739 A | * | 12/1989 | Frederick et al. ............ 365/221 |
| 5,214,607 A | * | 5/1993 | Duzan ......................... 365/221 |
| 5,305,253 A | * | 4/1994 | Ward ........................... 365/73 |
| 5,426,612 A | * | 6/1995 | Ichige et al. ................. 365/220 |
| 5,473,756 A | * | 12/1995 | Traylor .................. 365/189.12 |
| 5,852,748 A | * | 12/1998 | Hawkins et al. ....... 365/189.01 |

* cited by examiner

Primary Examiner—Richard Elms
Assistant Examiner—Tuan T. Nguyen
(74) Attorney, Agent, or Firm—Mills & Onello LLP

(57) ABSTRACT

A FIFO memory device includes a write address generating circuit generating a write address in response to a write clock signal and a read address generating circuit generating a read address in response to a read clock signal. A memory cell array includes a plurality of memory cells arranged between a plurality of write and read word lines and a plurality of write and read bit lines, the memory cell array storing write data in response to the write address and outputting read data in response to the read address. A flag signal generating circuit compares a next write address with a current read address to generate a full flag signal in response to the write clock signal when the next write address and the current read address are equal, and compares a current write address with a next read address to generate an empty flag signal in response to the read clock signal when the current write address and the next read address are equal.

13 Claims, 17 Drawing Sheets

(PROIR ART)

FIRST-IN FIRST-OUT MEMORY DEVICE AND METHOD OF GENERATING FLAG SIGNAL IN THE SAME

CROSS REFERENCE

This application claims the benefit of Korean Patent Application No. 2000-82094, filed on Dec. 26, 2000, under 35 U.S.C. §119, the entirety of which is hereby incorporated by reference.

BACKGROUND OF THE INVENTION

1. Field of the Invention

The present invention relates to a first-in first-out (FIFO) memory device and a method of generating a flag signal in the same.

2. Description of Related Art

In communication between different processors (or systems) having different data rates, there generally exists a difference between the speed at which one processor (or system) writes data and the speed at which the other processor (or system) reads data. The first-in first-out (FIFO) memory device is used to control data transmission between different processors having different data rate.

FIG. 1 is a block diagram illustrating data transmission between processors according to conventional art. Processors 10 and 12 and a FIFO memory device 14 are shown. As shown in FIG. 1, the processor 10 transfers input data IN to the FIFO memory device 14, and the processor 12 receives data from the FIFO memory device 14 to output data OUT. The processor 10 is faster in data rate than the processor 12.

The FIFO memory device 14 is reset in response to a reset signal output from the processor 10 and is enabled in response to a write enable signal WEB transferred from the processor 10 and stores write data WD in response to a write clock signal WCK. If the FIFO memory device 14 becomes full, the FIFO memory device 14 transfers a full flag signal Full to the processor 10 so that the processor 10 cannot write data. Also, the FIFO memory device 14 is enabled in response to a read enable signal REB transferred from the processor 12 and transfers read data RD to the processor 12 in response to a read clock signal RCK. If the FIFO memory device 14 becomes empty, the FIFO memory device 14 transfers an empty flag signal Empty to the processor 12 so that the processor 12 cannot read data.

The FIFO memory device 14 of FIG. 1 is configured to be reset in response to the reset signal output from the processor 10 but may be configured to be reset in response to a reset signal applied from another controller (not shown) other than the processors 10 and 12.

As described above, the FIFO memory device 14 is arranged between the two processors 10 and 12 to facilitate data transfer between the different processors having different data rates.

FIG. 2 is a block diagram illustrating a configuration of the FIFO memory device of FIG. 1. As shown in FIG. 2, the FIFO memory device includes a dual port memory cell array 20, a write pulse generating circuit 22, a write address generating circuit 24, a write data register 26, a read pulse generating circuit 28, a read address generating circuit 30, a read data register 32, and a flag generating circuit 34.

The dual port memory cell array 20 writes data in response to a write address WA and reads data in response to a read address RA. The write pulse generating circuit 22 generates an internal write clock signal iWCK in response to an inverted write enable signal WEB and a write clock signal WCK when the full flag signal Full is not active. The write address generating circuit 24 is reset in response to the reset signal and generates a write address WA in response to the internal write clock signal iWCK. The write data register 26 stores write data WD in response to the internal write clock signal iWCK to output it to the dual port memory cell array 20. The read pulse generating circuit 28 generates an internal read clock signal iRCK in response to an inverted read enable signal REB and a read clock signal RCK when the empty flag signal Empty is not active. The read address generating circuit 30 is reset in response to the reset signal and generates a read address RA in response to an internal read clock signal iRCK. The read data register 32 outputs read data RD output from the dual port memory cell array 20 in response to the internal read clock signal iRCK. The flag generating circuit 34 compares a write address WA with a read address RA in response to the reset signal, and generates a full flag signal Full in response to an internal write clock signal iWCK and generates an empty flag signal Empty in response to an internal read clock signal iRCK when a write address WA and a read address RA are equal.

FIG. 3 is a circuit diagram illustrating a configuration of the dual port memory cell array of FIG. 2. The dual port memory cell array includes an m_n-number of memory cells MC connected, respectively, between an n-number of write word lines wwl1 to wwln and an m-number of write bit line pairs wbl1 and wbl1b to wblm and wblmb, and between an n-number of read word lines rwl1 to rwln and an m-number of read bit line pairs rbl1 and rbl1b to rblm and rblmb.

As shown in FIG. 3, each of the memory cells MC includes NMOS transistors N1 and N2 for a write data transmission, NMOS transistors N3 and N4 for a read data transmission and a latch LA1 having inverters I1 and I2 for a data latch.

The NMOS transistors N1 and N2 transfer data of the write bit line pairs wbl1 and wbl1b to wblm and wblmb to nodes n1 and n2 in response to a signal transferred to the write word lines wwl1 to wwln, respectively. The NMOS transistors N3 and N4 transfer data of the nodes n1 and n2 to the read bit line pairs rbl1 and rbl1b to rblm and rblmb in response to a signal transferred to the read word lines rwl1 to rwln, respectively. The latch LA1 latches data of the nodes n1 and n2.

FIG. 4 is a circuit diagram illustrating a configuration of the write address generating circuit of FIG. 2. The write address generating circuit includes a column address generating circuit 40 and a row address generating circuit 42. The column address generating circuit 40 includes n-bit serial sequential shift registers WCA0 to WCA(n−1), and the row address generating circuit 42 includes m-bit serial sequential shift registers WRA0 to WRA(m−1).

The n-bit serial sequential shift registers WCA0 to WCA (n−1) include a register WCA0 and registers WCA1 to WCA(n−1). The register WCA0 includes a master portion having a CMOS transmission gate C1, an NMOS transistor NM1 and a latch LA2 having inverters I3 and I4, and a slave portion having a CMOS transmission gate C2 and a latch LA3 having inverters I5 and I6. Each of the registers WCA1 to WCA(n−1) includes a master portion having a CMOS transmission gate C3, a PMOS transistor PM1 and a latch LA4 having inverters I7 and I8 and a slave portion having a CMOS transmission gate C4 and a latch LA5 having inverters I9 and I10.

The m-bit serial sequential shift registers WRA0 to WRA (m−1) include a register WRA0 having the same configuration as the register WCA0, and registers WRA1 to WRA(m−1) having the same configuration as the registers WCA1 to WCA(n−1).

The write address generating circuit further includes inverters I11 and I12, and a control circuit 44. The inverter I11 inverts an internal write clock signal iWCK to control the CMOS transmission gates C1 to C4 of the n-bit serial sequential shift registers WCA0 to WCA(n−1). The inverter I12 inverts a reset signal to control the NMOS transistor NM1 and the PMOS transistor PM1 of the shift registers WCA0 to WCA(n−1) and WRA0 to WRA(m−1). The control circuit 44 generates a control signal to control the CMOS transmission gates C1 to C4 of the m-bit serial sequential shift registers WRA0 to WRA(m−1).

Operation of the write address generating circuit of FIG. 4 is described in accordance with the following. The PMOS transistor PM1 and the NMOS transistor NM1 of the n-bit serial sequential shift registers WCA0 to WCA(n−1) and the m-bit serial sequential shift registers WRA0 to WRA(m−1) are turned on when a reset signal having a logic "high" level is applied. The latches LA2 and LA4 invert and latch signals transferred from the PMOS transistor PM1 and the NMOS transistor NM1 to generate a sequence "10 . . . 0" to write master column and row addresses wmca0 and wmca(n−1) to wmra0 and wmra(n−1). The CMOS transmission gates C2 and C4 of the n-bit serial sequential shift registers WCA0 to WCA(n−1) are turned on when the internal write clock signal iWCK is transited from a logic "low" level to a logic "high" level to transfer write slave column addresses wsca(n−1) and wsca0 to wsca(n−2) to the latches LA2 and LA4, respectively. Each of the latches LA2 and LA4 inverts and latches output signals of the CMOS transmission gates C1 and C3 to generate the write master column addresses wmca0 to wmca(n−1). The CMOS transmission gates C1 and C3 are turned on when the internal write clock signal is transited from a logic "high" level to a logic "low" level to transfer the write master column addresses wmca0 to wmca(n−1) to the latches LA3 and LA5, respectively. Each of the latches LA3 and LA5 inverts and latches output signals of the CMOS transmission gates C2 and C4 to generate the write slave column addresses wsca0 to wsca(n−1).

That is, the n-bit serial sequential shift registers WCA0 to WCA(n−1) reset the write master column addresses wmca0 to wmca(n−1) to "10 . . . 0" in response to a reset signal. And, whenever the internal write clock signal iWCK is transited from a logic "low" level to a logic "high" level, the write master column addresses wmca0 to wmca(n−1) are shifted by a 1-bit and are changed from "01 . . .0" to "00 . . . 1". Consequently, the n-bit serial sequential shift registers WCA0 to WCA(n−1) repeatedly perform a shifting operation of from "10 . . . 0" to "00 . . . 1".

The m-bit serial sequential shift registers WRA0 to WRA(m−1) perform the same operation as the n-bit serial sequential shift registers WCA0 to WCA(n−1). However, the m-bit serial sequential shift registers WRA0 to WRA(m−1) perform a shifting operation in response to an output signal of the control circuit 44 instead of the internal clock signal iWCK of the CMOS transmission gates C1 to C4. When the write slave column address wsca(n−1) is "1", an output signal of the control circuit 44 becomes "0", so that the control circuit 44 does not perform a shifting operation. However, when the write slave column address wsca(n−1) is "0", an output signal of the control circuit 44 becomes "1", so that the control circuit 44 performs a shifting operation. That is, the m-bit serial sequential shift registers WRA0 to WRA(m−1) perform a shifting operation when a carrier is generated from the column address generating circuit 40, but do not perform a shifting operation when a carrier is not generated from the column address generating circuit 40.

The write master column addresses wmca0 to wmca(n−1) generated from the write address generating circuit of FIG. 4 are used as signals to select the write bit line pairs wbl1 and wbl1b to wblm and wblmb of the dual port memory cell array of FIG. 3 and are used as signals to select the write word lines wwl1 to wwln of the dual port memory cell array of FIG. 3 by the write master row addresses wmra0 to wmra(m−1).

FIG. 5 is a circuit diagram illustrating the read address generating circuit of FIG. 2. The read address generating circuit of FIG. 5 has a similar configuration to that of the write address generating circuit of FIG. 4. Reference numeral 50 represents a column address generating circuit, and the column address generating circuits 40 and 50 of FIGS. 4 and 5 perform analogous operations. Reference numeral 52 represents a row address generating circuit, and the row address generating circuits 42 and 52 of FIGS. 4 and 5 perform analogous operations. References RCA0 to RCA(n−1) represent n-bit serial sequential shift registers, and the n-bit serial sequential shift registers WCA0 to WCA(n−1) and RCA0 to RCA(n−1) of FIGS. 4 and 5 perform analogous operations. References RRA0 to RRA(m−1) represent m-bit serial sequential shift registers, and the m-bit serial sequential shift registers WRA0 to WRA(m−1) and RRA0 to RRA(m−1) perform analogous operations. A reference iRCK represents an internal read clock signal, and the internal read clock signal iRCK substitutes for the internal write clock signal iWCK of FIG. 4. References rmca0 to rmca(n−1) and rmra0 to rmra(m−1) represent read master column and row addresses, respectively, and the read master column and row addresses rmca0 to rmca(n−1) and rmra0 to rmra(m−1) substitute for the write master column and row addresses wmca0 to wmca(n−1) and wmra0 to wmra(m−1).

As described above, the read address generating circuit of FIG. 5 operates in a similar manner to the write address generating circuit of FIG. 4. Therefore, description of its operation is omitted to avoid redundancy.

The read master column addresses rmca0 to rmca(n−1) generated from the read address generating circuit of FIG. 5 are used as signals to select the read bit line pairs rbl1 and rbl1 b to rblm and rblmb of the dual port memory cell array of FIG. 3 and are used as signals to select the read word lines rwl1 to rwlm of the dual port memory cell array of FIG. 3 by the read master row addresses rmra0 to rmra(m−1).

FIG. 6 is a block diagram illustrating the flag generating circuit of FIG. 2. The flag generating circuit of FIG. 6 includes a comparison circuit 60 and a flag signal generating circuit 62. The comparison circuit 60 compares the write master column and row addresses wmca0 to wmca(n−1) and wmra0 to wmra(m−1) with the read master column and row addresses rmca0 to rmca(n−1) and rmra0 to rmra(m−1), and generates a control signal CO when the write master column and row addresses wmca0 to wmca(n−1) and wmra0 to wmra(m−1) and the read master column and row addresses rmca0 to rmca(n−1) and rmra0 to rmra(m−1) become equal. The flag signal generating circuit 62 generates a full flag signal Full when the control signal CO is generated in response to the internal write clock signal iWCK and generates an empty flag signal Empty when the control signal CO is not generated in response to the internal read clock signal iRCK.

FIG. 7 is a timing diagram illustrating the full flag signal generated from the flag generating circuit of FIG. 6. In particular, FIG. 7 shows the full flag signal generation timing diagram when the inverted write enable signal WEB (not shown) and the write clock signal WCK that are at a logic "low" level and the inverted read enable signal REB (not shown) and the read clock signal RCK that are at a logic "high" level are generated from an external portion.

The internal write clock signal iWCK is generated in response to the write clock signal WCK, and the write address WA is shifted in response to the internal write clock signal iWCK, so that all write addresses from the first write address wm0 to the last write address wm(k1) are generated, and then the first write address wm0 is generated again. At this time, the read address rmo and the write address wm0 become equal, so that the control signal CO is generated. The full flag signal Full is generated by the control signal CO generated in response to the internal write clock signal iWCK.

However, since the flag generating circuit of the conventional FIFO memory device generates the full flag signal Full by comparing the current write address with the current read address, there is a problem in that an interval TFull between a write clock signal generating time and a full flag signal generating time point is long.

FIG. 8 is a timing diagram illustrating the empty flag signal generated from the flag generating circuit of FIG. 6. In particular, FIG. 8 shows the empty flag signal generation timing diagram when the inverted read enable signal WEB (not shown) and the write clock signal WCK that have a logic "low" level and the inverted read enable signal REB (not shown) and the read clock signal RCK that have a logic "low" level are generated from an external portion. Also, in FIG. 8, the read clock signal RCK is faster in clock cycle than the write clock signal WCK.

The internal write clock signal iWCK is generated in response to the write clock signal WCK, and the write address WA is generated in response to the internal write clock signal iWCK. The internal read clock signal iRCK is generated in response to the read clock signal RCK, and the read address RA is generated in response to the internal read clock signal iRCK. When the write address wm(k−8) is generated, and the read address rm(k−8) is generated, the control signal CO is generated. At this time, the control signal CO is generated as the empty flag signal Empty in response to the internal read clock signal iRCK.

However, since the flag generating circuit of the conventional FIFO memory device generates the empty flag signal Empty by comparing the current write address with the current read address, there is a problem in that an interval TEmpty between a read clock signal generating time and an empty flag signal generating time point is long.

That is, the flag generating circuit of the conventional FIFO memory device generates flag signals after the current write address or the current read address is generated and thus is not suitable for a high-speed system.

SUMMARY OF THE INVENTION

To overcome the problems described above, the present invention provides a FIFO memory device having an advanced flag signal generating time point. The invention also provides a method of generating flag signals in a FIFO memory device that can advance a flag signal generating time point.

Accordingly, the present invention is directed to a FIFO memory device. The device of the invention includes a write address generating means generating a write address in response to a write clock signal. A read address generating means generates a read address in response to a read clock signal. A memory cell array includes a plurality of memory cells arranged between a plurality of write and read word lines and a plurality of write and read bit lines, the memory cell array storing write data in response to the write address and outputting read data in response to the read address. A flag signal generating means compares a next write address with a current read address to generate a full flag signal in response to the write clock signal when the next write address and the current read address are equal, and compares a current write address with a next read address to generate an empty flag signal in response to the read clock signal when the current write address and the next read address are equal.

The present invention further provides a method of generating a flag signal. The method includes providing a FIFO memory device including a plurality of memory cells arranged between a plurality of write and read word lines and a plurality of write and read bit lines, the plurality of memory cells storing write data in response to a write address and outputting read data in response to a read address. The write address is generated in response to a write clock signal and the read address is generated in response to a read clock signal. A next write address is compared with a current read address to generate a full flag signal in response to the write clock signal when the next write address and the current read address are equal, and a currrent write address is compared with a next read address to generate an empty flag signal in response to the read clock signal when the current write address and the write read address are equal.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFFERED EMBODIMENTS

Figure 1:
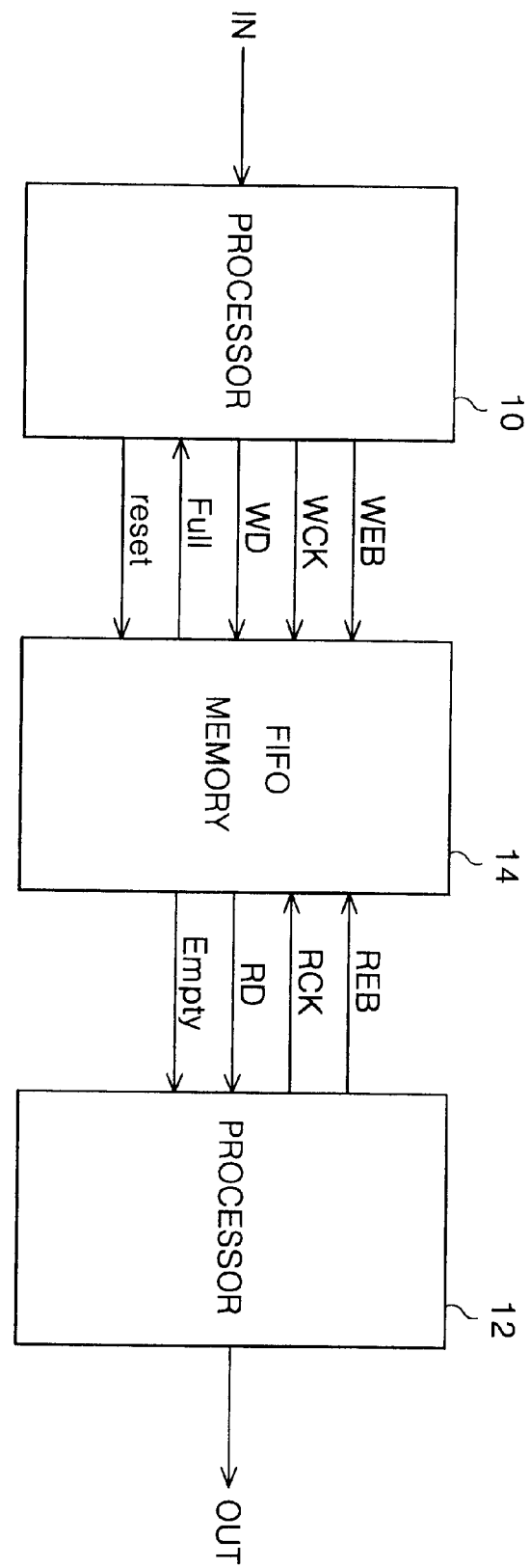
FIG. 1 is a block diagram illustrating data transmission between processors according to conventional art.
Figure 2:
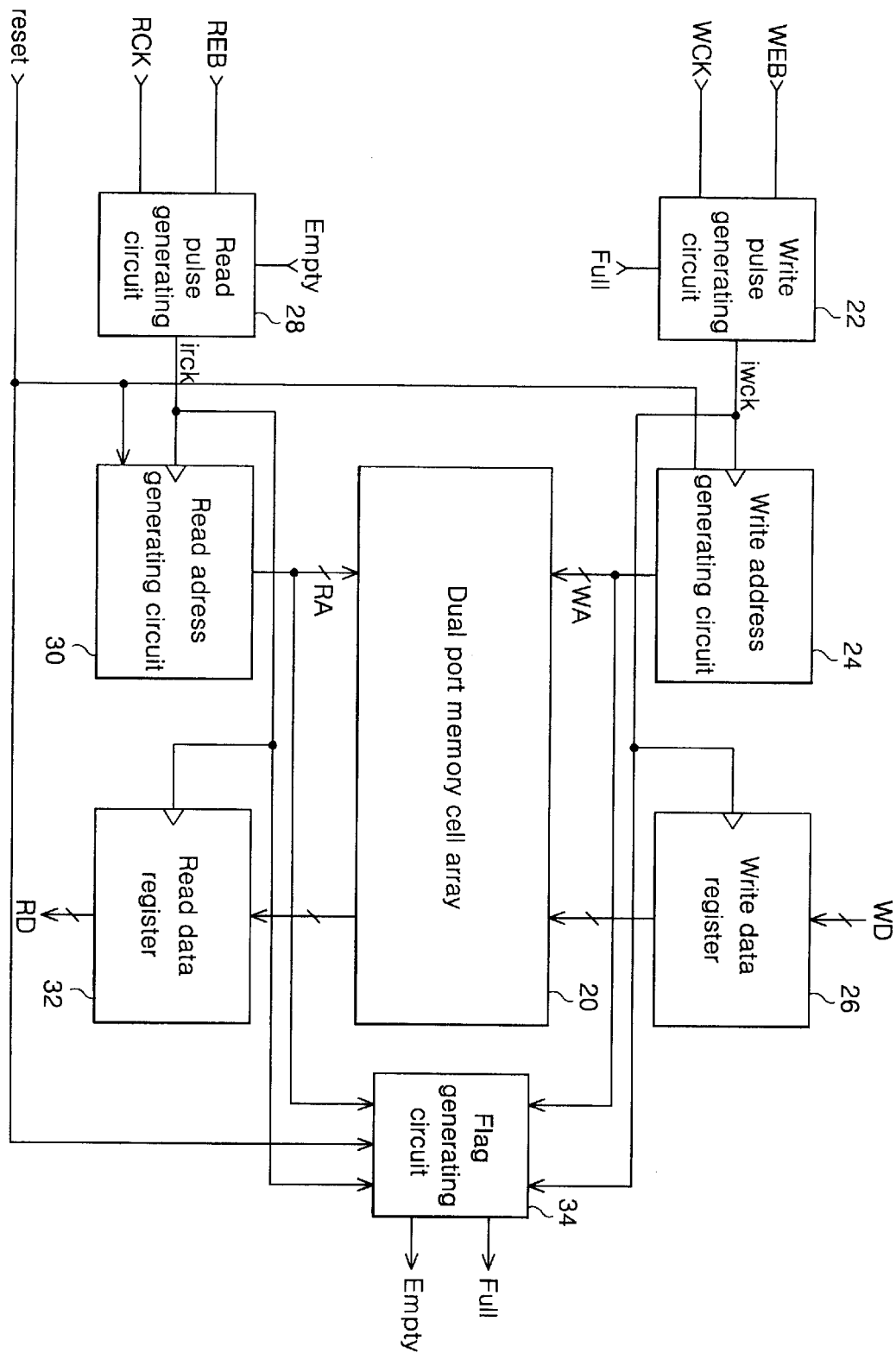
FIG. 2 is a block diagram illustrating a configuration of a FIFO memory device of FIG. 1.
Figure 3:
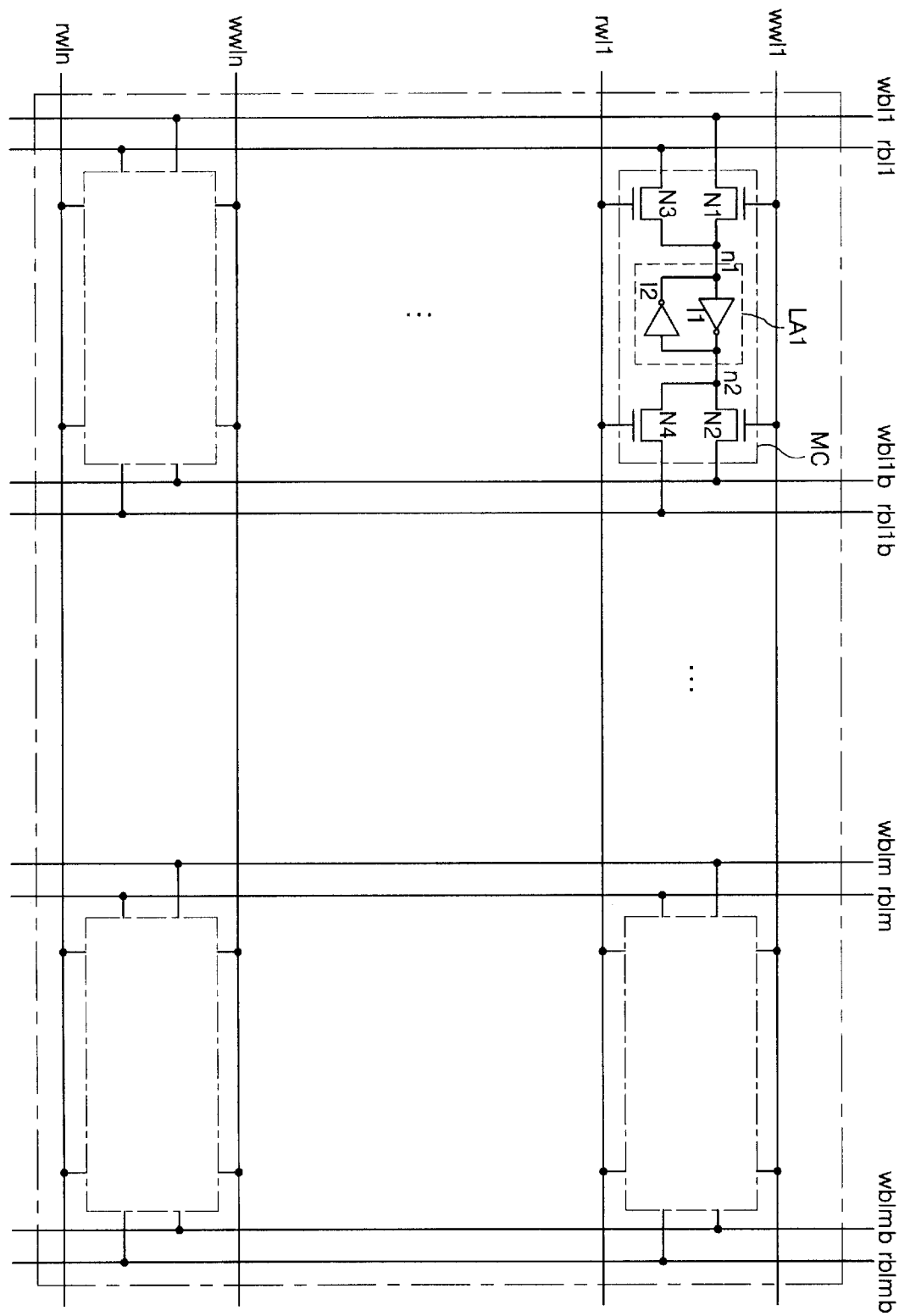
FIG. 3 is a circuit diagram illustrating a configuration of a dual port memory cell array of FIG. 2.
Figure 4:
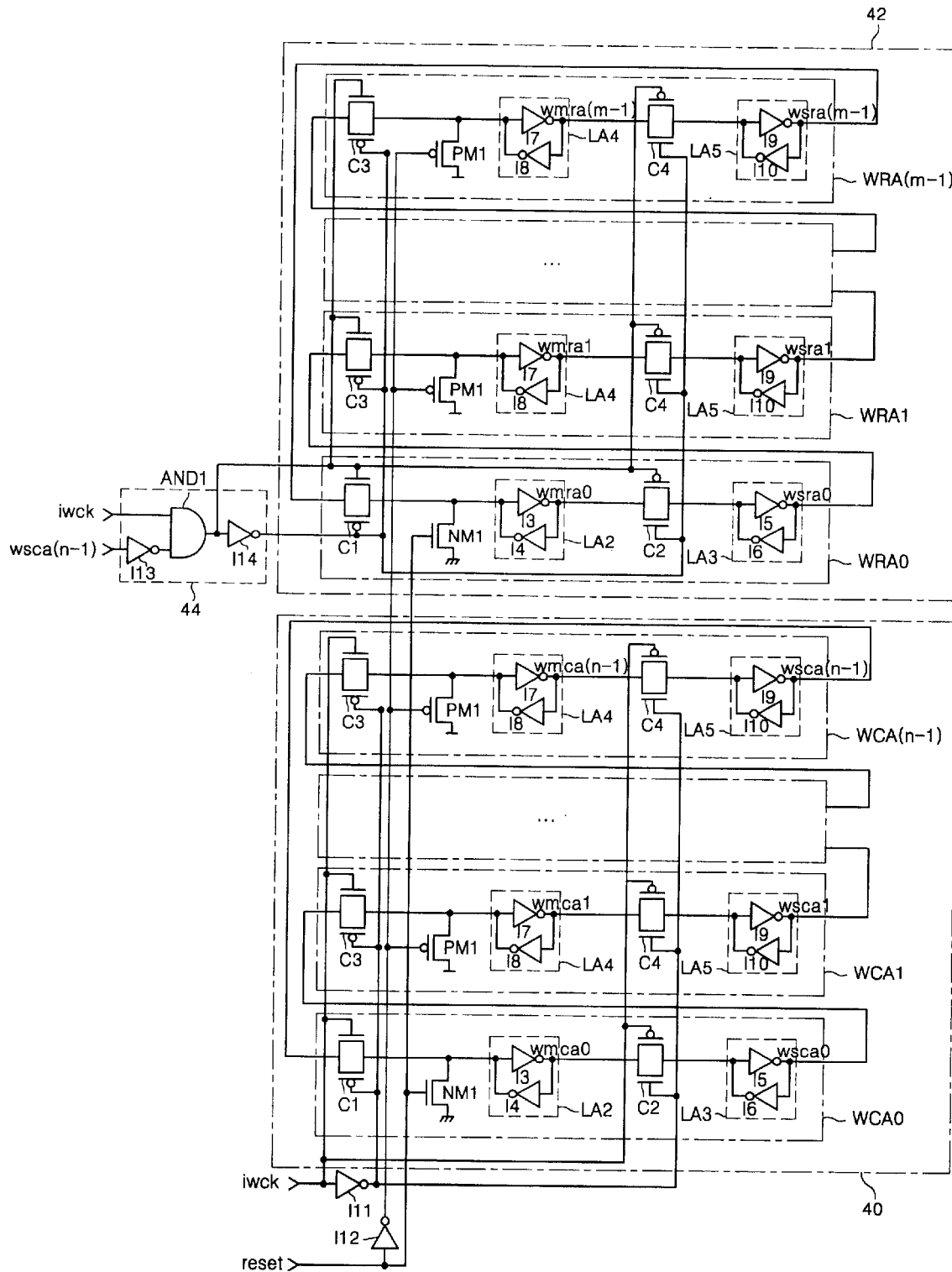
FIG. 4 is a circuit diagram illustrating a configuration of a write address generating circuit of FIG. 2.
Figure 9:
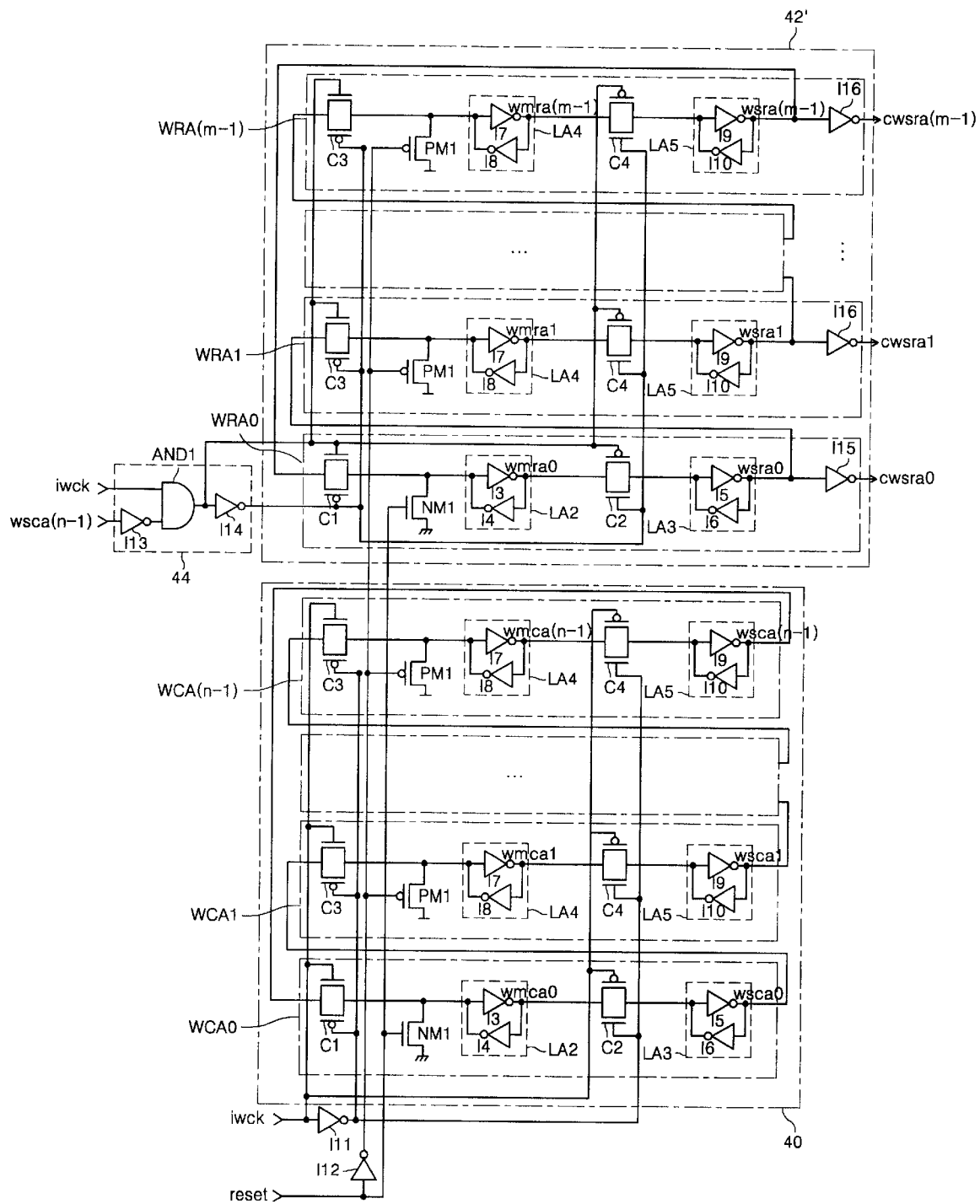
FIG. 9 is a circuit diagram illustrating a configuration of a write address generating circuit according to an embodiment of the present invention.

FIG. 9 is a circuit diagram illustrating a configuration of a write address generating circuit according to an embodiment of the present invention. The write address generating circuits of FIGS. 4 and 9 have analogous configurations, with the exception of the write row address generating circuit 42'. The write row address generating circuit 42' includes an inverter I15 added to the registers WRA0 and an inverter I16 added to each of the registers WRA1 to WRA(m−1) in comparison to the write row address generating circuit 42 of FIG. 4.

The inverter I15 of the register WRA0 inverts the write slave row address wsra0 to generate the address cwsra0. Each of the inverters I16 of the register WRA1 to WRA(m−1) inverts the write slave row addresses wsra1 to wsra(m−1), respectively, to generate the addresses cwsra1 to cwsra(m−1). The inverters I15 and I16 generate, in advance, a next write master row address at a current state. That is, added inverters I15 and I16 allow the next write master row address to be generated at a current state without changing a current row address.

Figure 5:
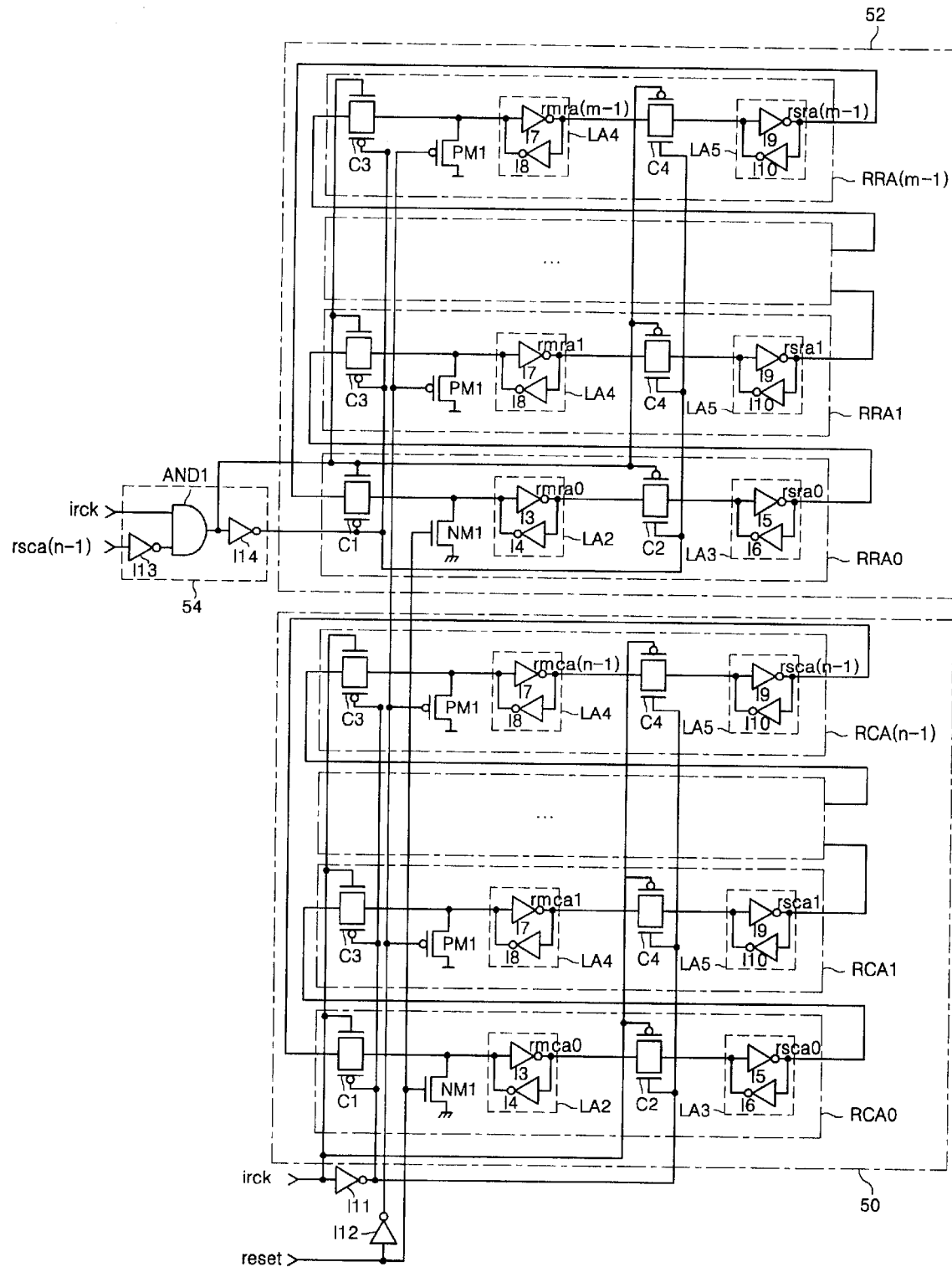
FIG. 5 is a circuit diagram illustrating a configuration of a read address generating circuit of FIG. 2.
Figure 6:
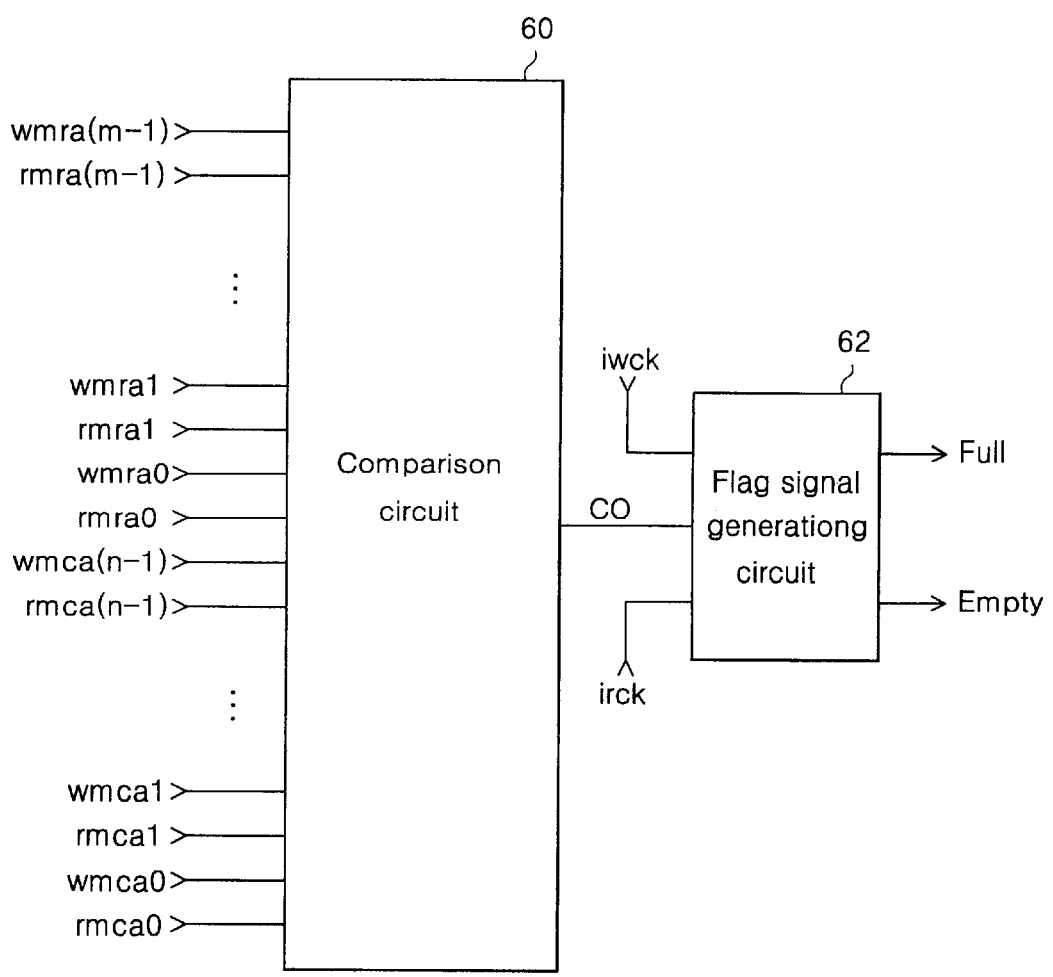
FIG. 6 is a block diagram illustrating a flag generating circuit of FIG. 2.
Figure 10:
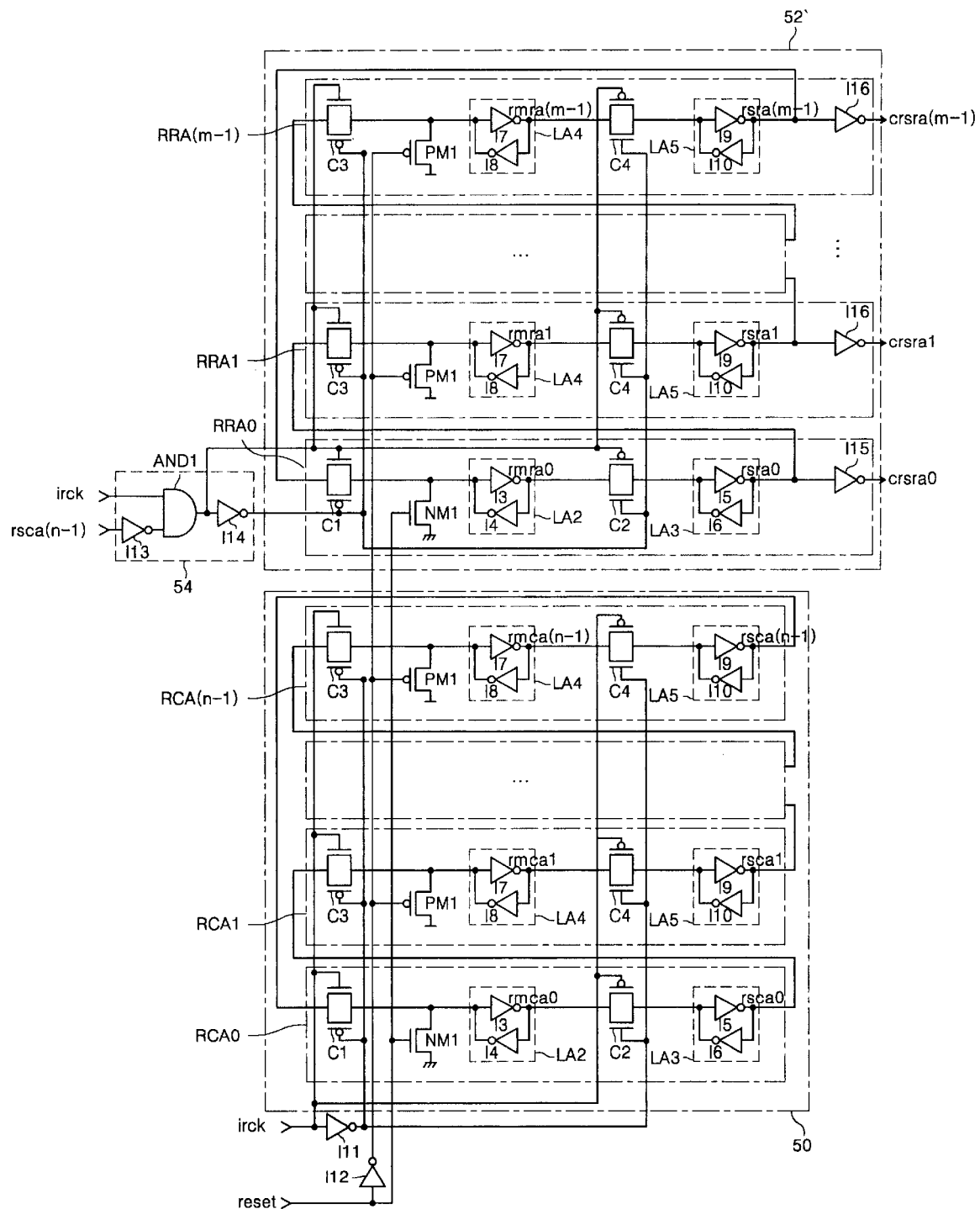
FIG. 10 is a circuit diagram illustrating a read address generating circuit according to an embodiment of the present invention.

FIG. 10 is a circuit diagram illustrating a read address generating circuit according to an embodiment of the present invention. The read address generating circuits of FIGS. 5 and 10 have analogous configurations, with the exception of a read row address generating circuit 52'. The read row address generating circuit 52' includes an inverter I15 added to the registers RRA0 and an inverter I16 added to each of the registers RRA1 to RRA(m−1) in comparison to the read row address generating circuit 52 of FIG. 5.

The inverter I15 of the register RRA0 inverts the read slave row address rsra0 to generate the address crsra0. Each of the inverters I16 of the registers RRA1 to RRA(m−1) inverts the read slave row addresses rsra1 to rsra(m−1), respectively, to generate the addresses crsra1 to crsra(m−1). The inverters I15 and I16 generate, in advance, a next read master row address at a current state. That is, added inverters I15 and I16 allow the next read master row address to be generated at a current state without changing a current row address.

Figure 11A:
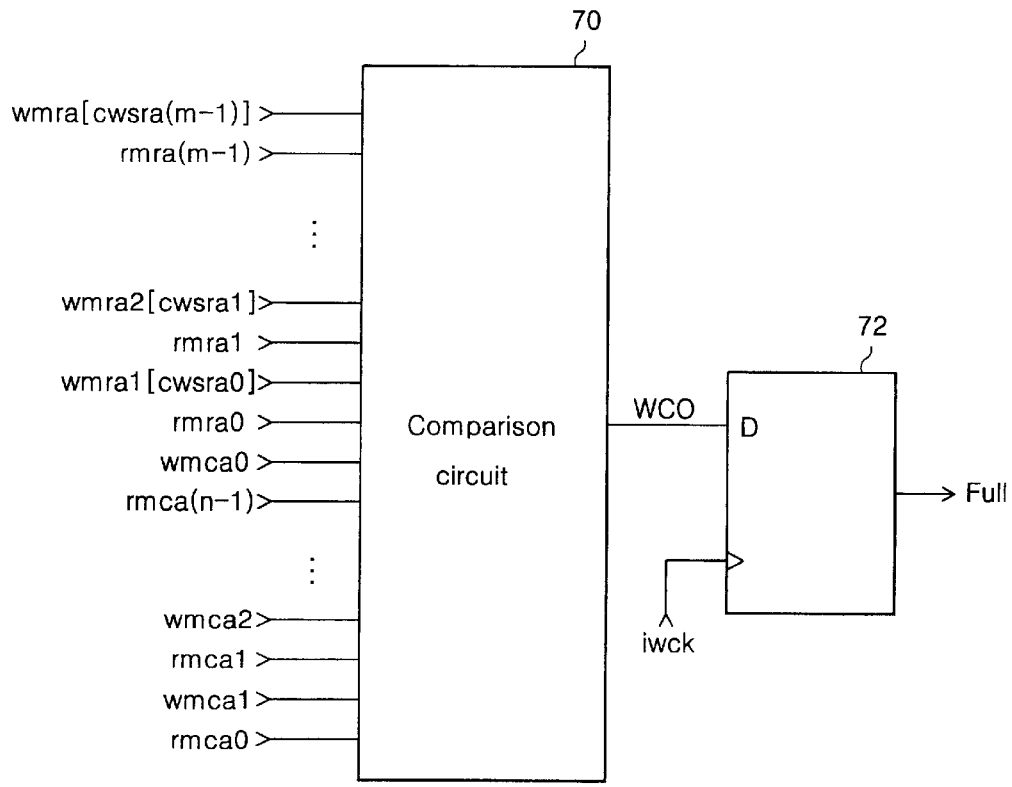
FIG. 11A is a block diagram illustrating a full flag signal generating circuit according to an embodiment of the present invention.

FIG. 11A is a block diagram illustrating a full flag signal generating circuit. The full flag signal generating circuit of FIG. 11A includes a comparison circuit 70 and a flip-flop 77. When the write slave column address wsca(n−1) is 1, the comparison circuit 70 compares the write master row and column addresses wmra0, wmra(m−1) to wmra1, wmca0, and wmca(n−1) to wmca1 with the read row and column addresses rmra(m−1) to rmra0 and rmcan to rmca1, respectively. Also, when the write slave column address wsca(n−1) is 0, the comparison circuit 70 compares the write row and column addresses cwsra(m−1) to cwsra0, wmca0, wmca(n−1) to wmca1 with the read row and column addresses rmra(m−1) to rmra0 and rmca(n−1) to rmca1, respectively. At this moment, when the comparison results are equal, the comparison circuit 70 generates a control signal WCO. The flip-flop 72 latches the control signal WCO in response to the internal write clock signal iWCK to generate a full flag signal Full.

Figure 11B:
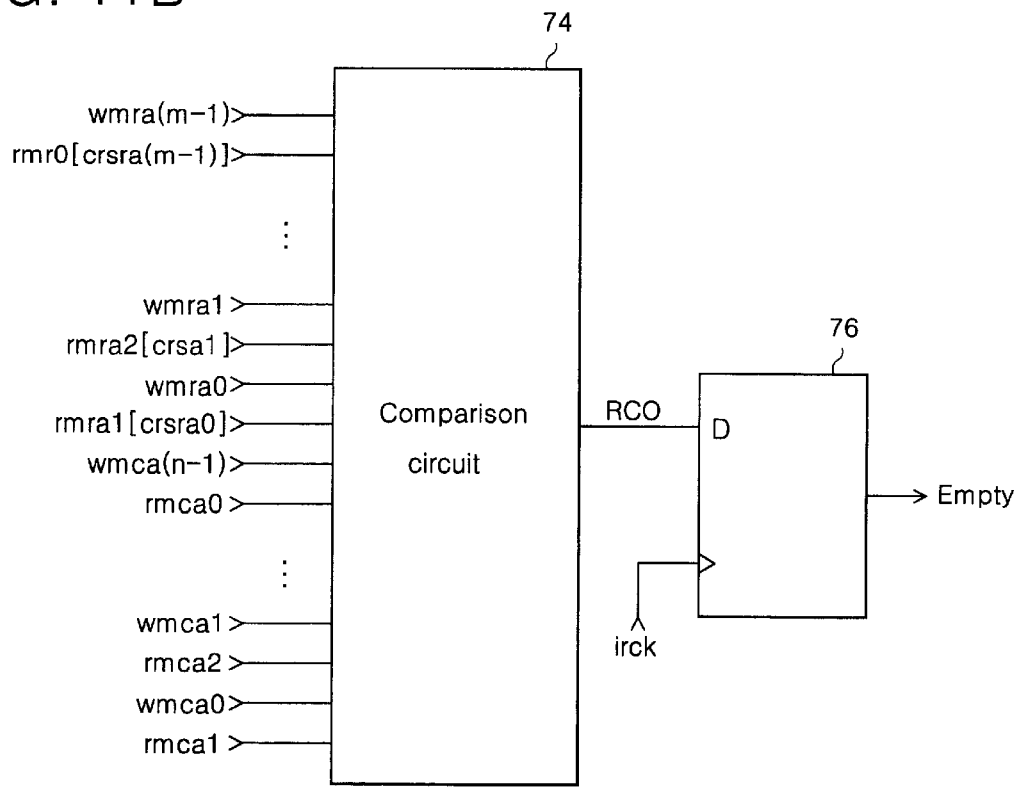
FIG. 11B is a block diagram illustrating an empty flag signal generating circuit according to an embodiment of the present invention.

FIG. 11B is a block diagram illustrating an empty flag signal generating circuit. The empty flag signal generating circuit of FIG. 11B includes a comparison circuit 74 and a flip-flop 76. When the read slave column address rsca(n−1) is 1, the comparison circuit 74 compares the write master row and column addresses wmra(m−1) to wmra0 and wmca(n−1) to wmca1 with the read row and column addresses rmra0, rmra(m−1) to rmra1, rmca0, and rmca(n−1) to rmca1, respectively. Also, when the read slave column address rsca(n−1) is 0, the comparison circuit 74 compares the write row and column addresses wmra(m−1) to wmra0 and wmca(n−1) to wmca0 with the read row and column addresses crsra(m−1) to crsra0 and rmca(n−1) to rmca1, respectively. At this moment, when the comparison results are equal, the comparison circuit 74 generates a control signal RCO. The flip-flop 76 latches the control signal RCO in response to the internal read clock signal iRCK to generate an empty flag signal Empty.

The flag signal generating circuit of the FIFO memory device according to the present invention compares a next write master row and column address with a current read master row and column address to generate the full flag signal Full, and compares a next read master row and column address with a current write master row and column address to generate the empty flag signal Empty. Therefore, the inventive flag signal generating circuit can advance the time at which the flag signals are generated, i.e., the flags can be generated earlier.

However, the write and read address generating circuits of FIGS. 9 and 10 require shift registers which can be complex because they are serially connected and can be as wide as the word line and bit line pair.

Figure 12:
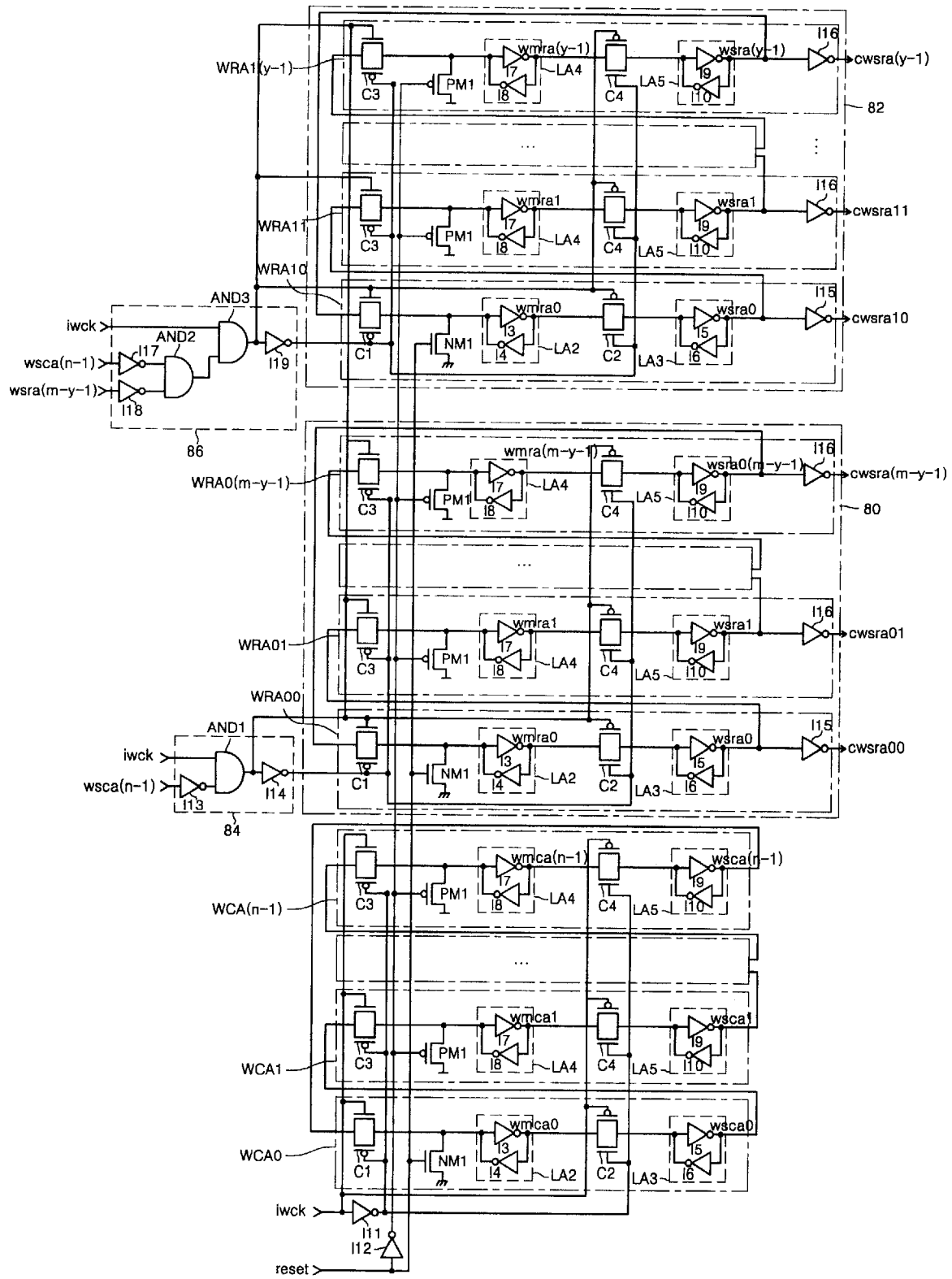
FIG. 12 is a circuit diagram illustrating a configuration of a write address generating circuit according to another embodiment of the present invention.

FIG. 12 is a circuit diagram illustrating a configuration of a write address generating circuit according to another embodiment of the present invention. The write address generating circuit of FIG. 12 includes a column address generating circuit 40 comprising the n-bit serial sequential shift registers WCA0 to WCA(n−1), a row address generating circuit comprising a (m−y)-bit serial sequential shift registers WRA10 to WRA1(m−y−1) and a y-bit serial sequential shift registers WRA00 to WRA0(y−1), control circuits 84 and 86, and inverters I11 and I12.

The column address generating circuits of FIGS. 9 and 12 have analogous configurations. The (m−y)-bit serial sequential shift registers WRA00 to WRA0(m−y−1) are configured such that the (m−y)-number of registers constituting the m-bit serial sequential shift registers of FIG. 9 are serially connected. The y-bit serial sequential shift registers WRA10 to WRA1(y−1) are configured such that the y-number of registers constituting the m-bit serial sequential shift registers of FIG. 9 are serially connected.

The control circuits 44 and 84 of FIGS. 9 and 12 have analogous configurations. The control circuit 84 includes inverters I17 to I19 and AND gates AND2 and AND3.

The n-bit serial sequential shift registers WCA0 to WCA(n−1) are reset in response to a reset signal and perform a shifting operation in response to the internal write clock signal iWCK. That is, the n-bit serial sequential shift registers WCA0 to WCA(n−1) of FIG. 12 perform the same operation as the nbit serial sequential shift registers WCA0 to WCA(n−1) of FIG. 9.

The (m−y)-bit serial sequential shift registers WRA0o to WRA0(m−y−1) are reset in response to a reset signal and perform a shifting operation in response to an output signal of the control circuit 84. That is, the (m−y)-bit serial sequential shift registers WRA00 to WRA0(m−y−1) perform a shifting operation when a carrier is generated from the n-bit serial sequential shift registers WCA0 to WCA(n−1). That is, the (m−y)-bit serial sequential shift registers WRA00 to WRA0(m−y−1) of FIG. 12 perform the same operation as the (m−y)-bit serial sequential shift registers WRA0 to WRA(m−1) of FIG. 9.

The y-bit serial sequential shift registers WRA10 to WRA1(y−1) are reset in response to a reset signal and perform a shifting operation in response to an output signal of the control circuit 86. That is, the y-bit serial sequential shift registers WRA10 to WRA1(y−1) perform a shifting operation when carriers are generated from the n-bit serial sequential shift registers WCA0 to WCA(n−1) and the (m−y)-bit serial sequential shift registers WRA00 to WRA0(m−y−1).

The inverters I17 and I18 of the control circuit 86 invert the write slave column address wsca(n−1) generated from the n-bit serial sequential shift registers WCA0 to WCA(n−1) and the write slave row address wsra0(m−y−1) generated from the (m−y)-bit serial sequential shift registers WRA00 to WRA0(m−y−1) to detect the carriers. The AND gate AND2 ANDs output signals of the inverters I17 and I18, and the AND gate AND3 ANDs an output signal of the AND gate AND2 and the internal write clock signal iWCK. So the CMOS transmission gates C1 to C4 of the y-bit serial sequential shift registers WRA10 to WRA1(y−1) can be controlled using a signal to which the inverter I19 inverts the output signals of the AND gates AND2 and AND3.

As described above, the shift registers of FIG. 12 is configured by dividing the m-bit serial sequential shift registers into the (m−y)-bit serial shift registers and the y-bit serial sequential shift registers and, therefore, the number of the shift registers constituting the serial sequential shift registers is reduced, leading to a simplified circuit configuration.

Figure 13:
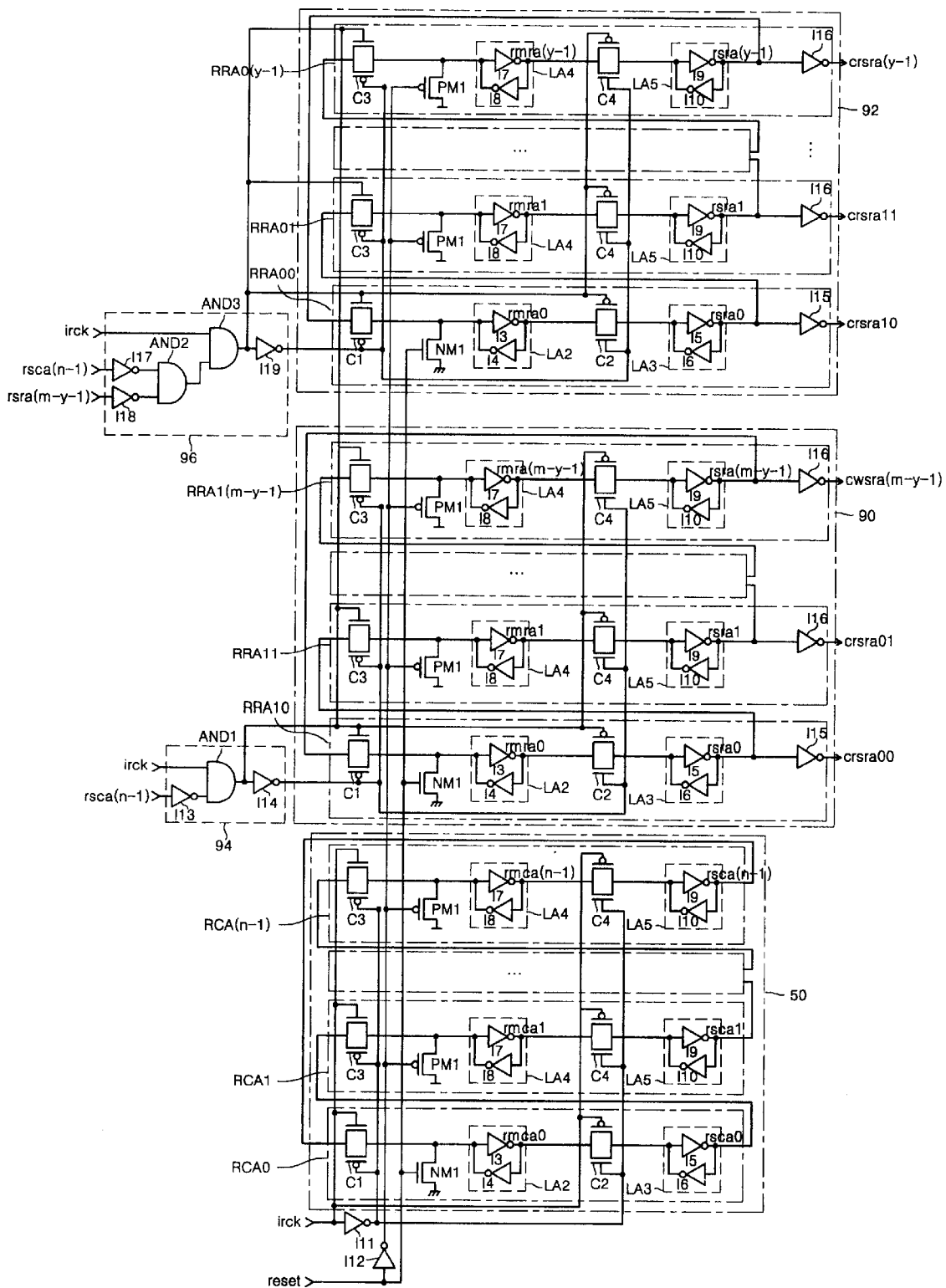
FIG. 13 is a circuit diagram illustrating a configuration of a read address generating circuit according to another embodiment of the present invention.

FIG. 13 is a circuit diagram illustrating a configuration of a read address generating circuit according to another embodiment of the present invention. The read address generating circuit of FIG. 13 includes a column address generating circuit 50 comprising the n-bit serial sequential shift registers RCA0 to RCA(n−1), a row address generating circuit comprising the (m−y)-bit serial sequential shift registers RRA10 to RRA1 (m−y−1) 90 and the y-bit serial sequential shift registers RRA00 to RRA0(y−1) 92, control circuits 94 and 96, and inverters I11 and I12.

The column address generating circuits of FIGS. 10 and 13 have analogous configurations. The (m−y)-bit serial sequential shift registers RRA10 to RRA1 (m−y−1) 90 are configured such that the (m−y)-number of the registers constituting the m-bit serial sequential shift registers of FIG. 10 are serially connected. The y-bit serial sequential shift registers RRA00 to RRA0(y−1) 92 are configured such that the y-number of registers constituting the m-bit serial sequential shift registers of FIG. 10 are serially connected.

The control circuits 94 and 96 have the same configuration as those of FIG. 12.

The preferred embodiments of the present invention include the row address generating circuit divided into the two shift registers, but the row address generating circuit may be divided into the three or more shift registers, in accordance with the invention.

Figure 14A:
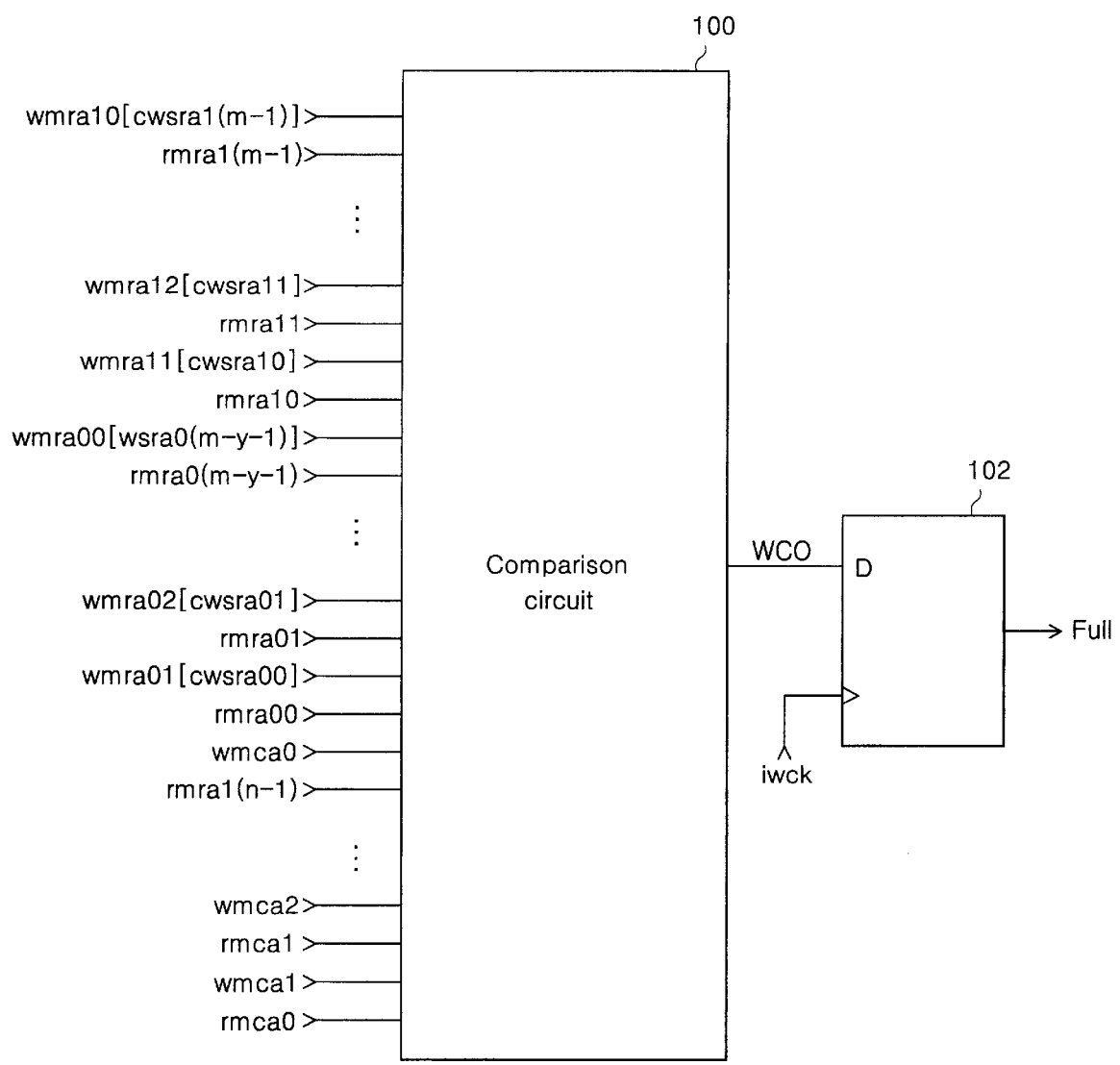
FIG. 14A is a block diagram illustrating a full flag generating circuit according to another embodiment of the present invention.

FIG. 14A is a block diagram illustrating a full flag generating circuit according to another preferred embodiment of the present invention. The full flag generating circuit of FIG. 14A includes a comparison circuit 100 and a flip-flop 102. When the write slave column address wsca(n−1) is 1, the comparison circuit 100 compares the write master row and column addresses wmra10, wmra(y−1) to wmra11, wmra00, and wmra0(m−y−1) to wmra01, wmca0, wmca(n−1), wmca1 with the read row and column addresses rmra1 (y−1) to rmra10, rmra(m−y−1) to rmra0 and rmcan to rmca1, respectively. Also, when the write slave column address wsca(n−1) is 0, the comparison circuit 100 compares the write row and column addresses cwsra(y−1) to cwsra0, cwsra(m−y−1) to cwsra0, wmca0, wmca(n−1) to wmca1 with the read row and column addresses rmra1(y−1) to rmra10, rmra(m−y−1) to rmra0 and rmcan to rmca1, respectively. At this moment, when the comparison results are equal, the comparison circuit 100 generates a control signal WCO. The flip-flop 102 latches the control signal WCO in response to the internal write clock signal iWCK to generate a full flag signal Full.

Figure 14B:
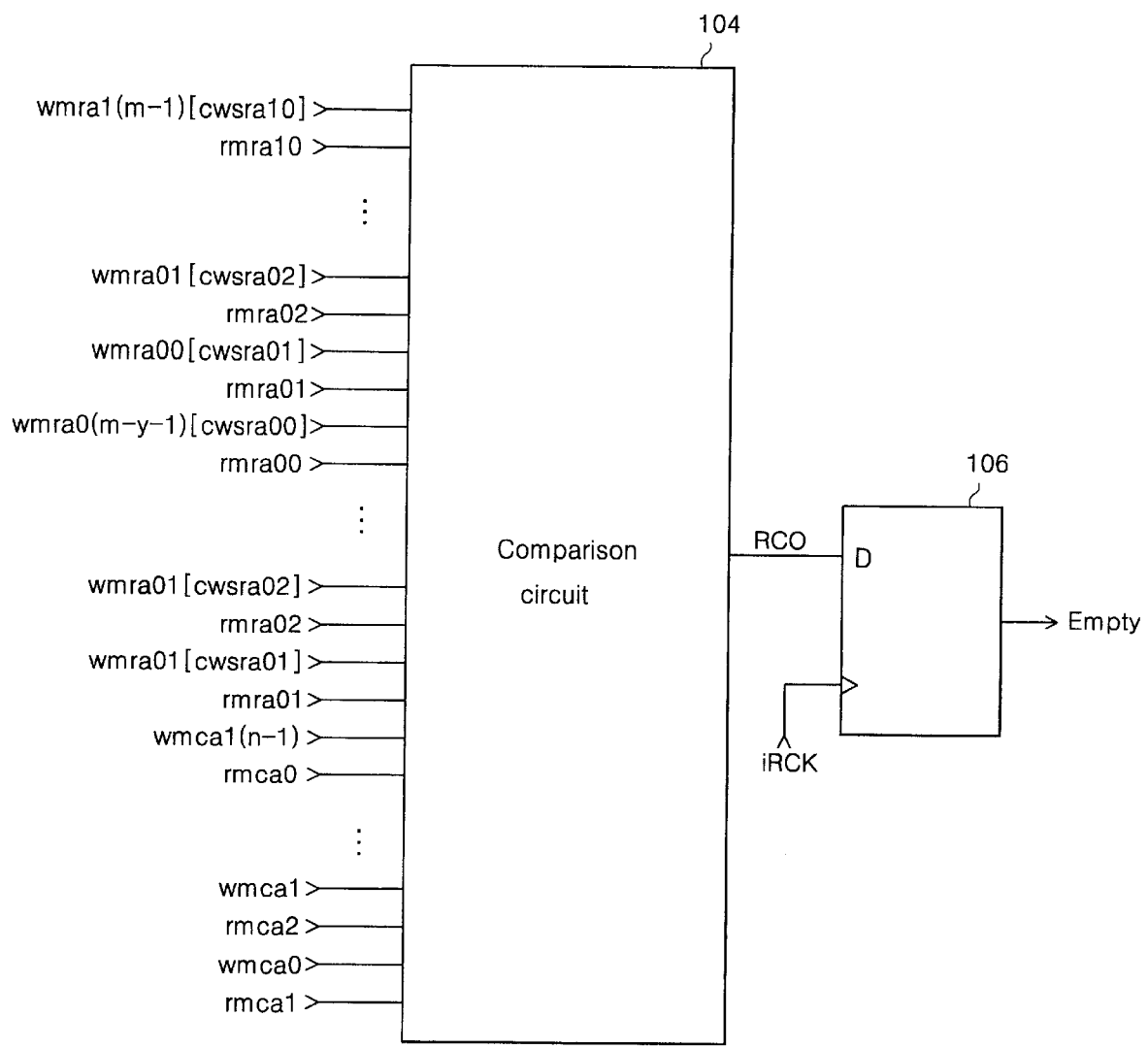
FIG. 14B is a block diagram illustrating an empty flag generating circuit according to another embodiment of the present invention.

FIG. 14B is a block diagram illustrating an empty flag generating circuit according to another preferred embodiment of the present invention. The empty flag generating circuit of FIG. 14B includes a comparison circuit 104 and a flip-flop 106. When the read slave column address rscan is 1, the comparison circuit 104 compares the write master row and column addresses wmra1(y−1) to wmra10, wmca0(m−y−1) to wmca00, and wmca(n−1) to wmca0 with the read row and column addresses rmra10, rmra1(y−1) to rmra11, rmca00, rmca(m−y−1) to rmca01, rmra0, and rmra(n−1) to rmra1, respectively. Also, when the read slave column address rsca(n−1) is 0, the comparison circuit 104 compares the write row and column addresses cwsra10, cwsra1(y−1) to cwsra11, cwsra00, cwsra0(y−1) to cwsca01, wmca(n−1) to wmca0 with the read row and column addresses rmca10 and rmca(n−1) to rmca1, respectively. At this moment, when the comparison results are equal, the comparison circuit 104 generates a control signal RCO. The flip-flop 106 latches the control signal RCO in response to the internal read clock signal iRCK to generate an empty flag signal Empty.

The flag signal generating circuit of the FIFO memory device according to another preferred embodiment of the present invention compares a next write master row and column address with a current read master row and column address to generate the full flag signal Full, and compares a next read master row and column address with a current write master row and column address to generate the empty flag signal Empty.

Figure 15:
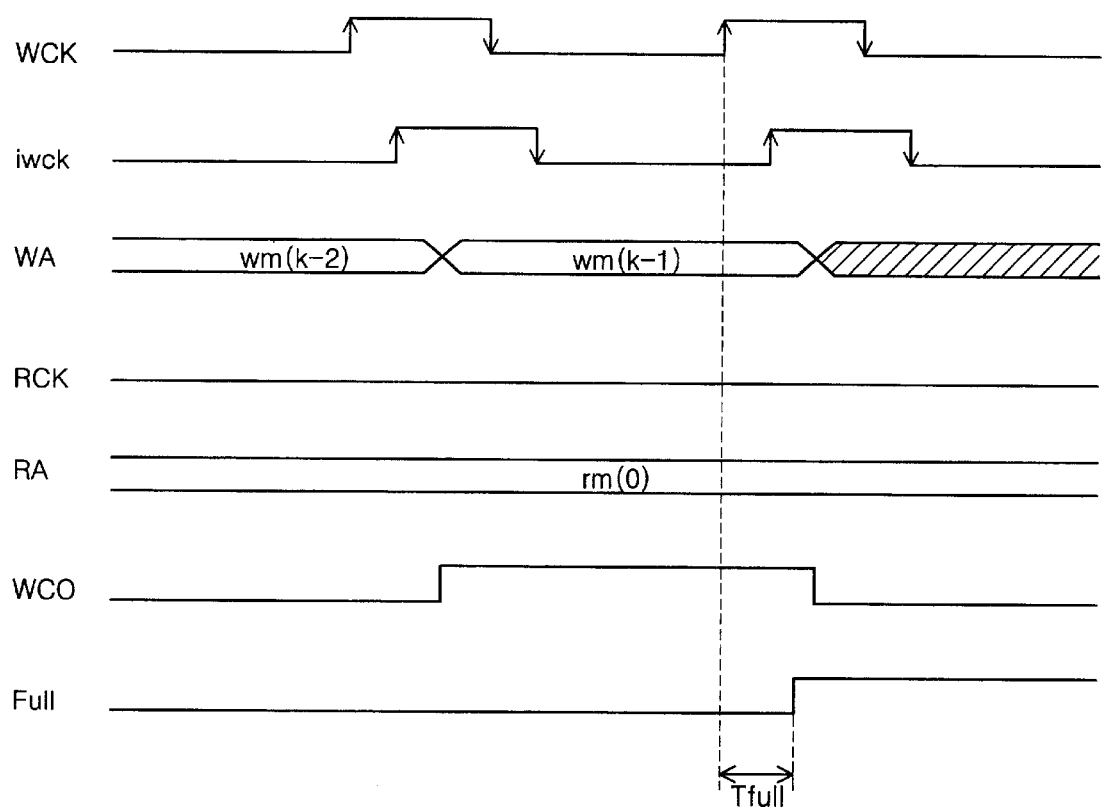
FIG. 15 is a timing diagram illustrating the full flag signal generated from the flag generating circuit of FIG. 14A.

FIG. 15 is a timing diagram illustrating the full flag signal generated from the flag generating circuit of FIG. 14A. In particular, FIG. 15 shows the full flag signal generation timing diagram when the inverted write enable signal WEB (not shown) and the write clock signal WCK that have all a logic low level and the inverted read enable signal REB (not shown) and the read clock signal RCK that have all a logic high level are generated from an external portion.

Figure 7:
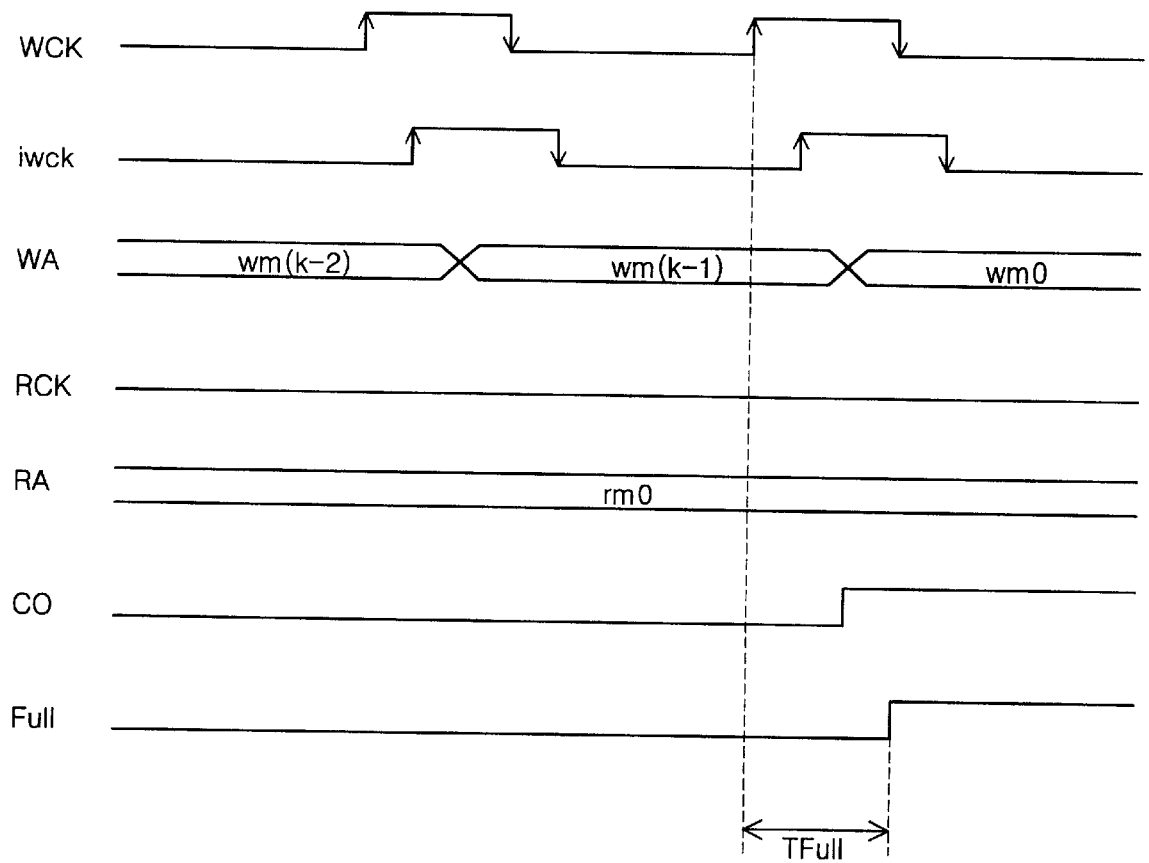
FIG. 7 is a timing diagram illustrating a full flag signal generated from the flag generating circuit of FIG. 6.

When the last write address wm(k−1) is generated in such a manner as shown in FIG. 7, the first next write address wm0 other than the last write address wm(k–1) is compared with the read address rm0. When the write address wm0 and the read address rm0 are equal, the control signal WCO is generated. The full flag signal Full is output by latching the control signal WCO in response to the internal write clock signal iWCK.

Therefore, the full flag signal generating circuit of the FIFO memory device according to the preferred embodiments of the present invention has an advantage in that an interval TFull between a write clock signal generating time and a full flag signal generating time point is short.

Figure 16:
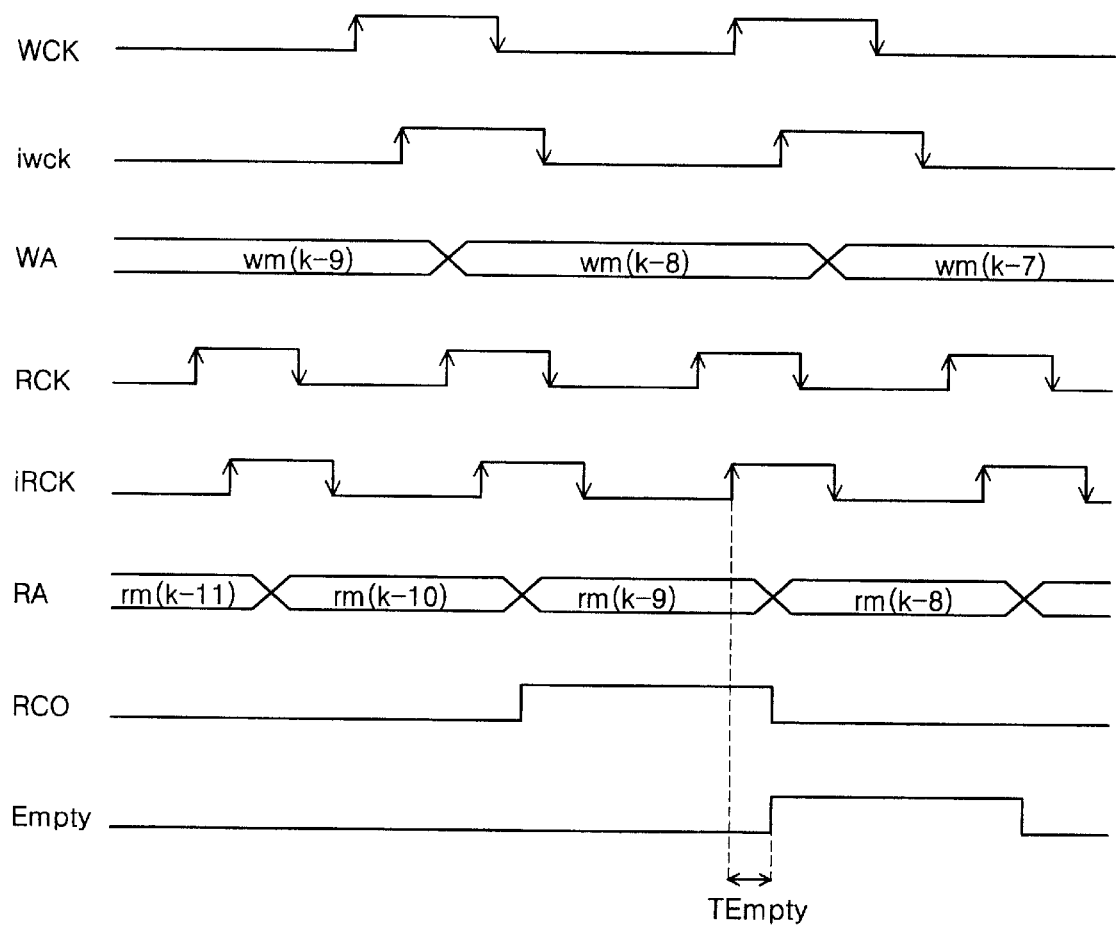
FIG. 16 is a timing diagram illustrating the empty flag signal generated from the flag generating circuit of FIG. 14B.

FIG. 16 is a timing diagram illustrating the empty flag signal generated from the flag generating circuit of FIG. 14B. In particular, FIG. 16 shows the empty flag signal generation timing diagram when the inverted read enable signal WEB (not shown) and the write clock signal WCK that have all a logic low level and the inverted read enable signal REB (not shown) and the read clock signal RCK that have all a logic low level are generated from an external portion. Also, in FIG. 16, the read clock signal RCK is faster in clock cycle than the write clock signal WCK.

Figure 8:
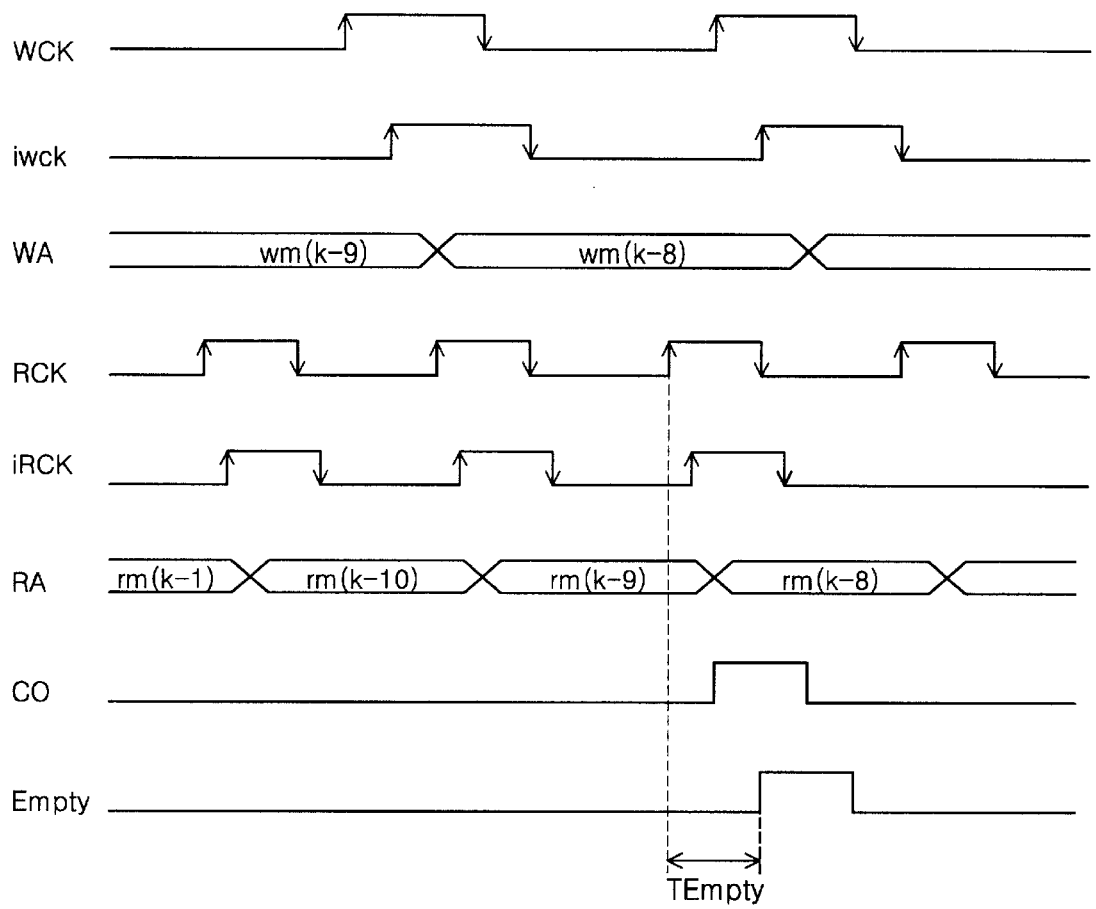
FIG. 8 is a timing diagram illustrating an empty flag signal generated from the flag generating circuit of FIG. 6.

When the write address wm(k–8) is generated in such a manner as shown in FIG. 8, the current write address wm(k–8) is compared with the next read address rm(k–8) other than the current read address rm(k–8). When the current write address wm(k–8) and the next read address rm(k–8) are equal, the control signal RCO is generated. The empty flag signal Empty is output by latching the control signal RCO in response to the internal read clock signal iRCK.

Therefore, the empty flag signal generating circuit of the FIFO memory device according to the preferred embodiments of the present invention has an advantage in that an interval TEmpty between a read clock signal generating time and an empty flag signal generating time point is short.

As described herein before, the flag signal generating circuit of the FIFO memory device according to the preferred embodiments of the present invention compares the next write address with the current read address to generate the full flag signal, and compares the current write address with the next read address to generate the empty flag signal and thus can advance the flag signal generating time point. Therefore, the flag signal generating circuit of the FIFO memory device according to the preferred embodiments of the present invention is suitable for a high-speed system.

In the preferred embodiments of the present invention, the shift register is configured using the write address generating circuit and read address generating circuit, but the shift register can be configured using a counter.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A FIFO memory device, comprising:
a write address generating means generating a write address in response to a write clock signal;
a read address generating means generating a read address in response to a read clock signal;
a memory cell array including a plurality of memory cells arranged between a plurality of write and read word lines and a plurality of write and read bit lines, said memory cell array storing write data in response to the write address and outputting read data in response to the read address; and
a flag signal generating means comparing a next write address with a current read address to generate a full flag signal in response to the write clock signal when the next write address and the current read address are equal, and comparing a current write address with a next read address to generate an empty flag signal in response to the read clock signal when the current write address and the next read address are equal.

2. The device of claim 1, wherein the write address generating means includes:
a write column address generating means generating a write column address for selecting the plurality of the write bit lines; and
a write row address generating means generating a write row address for selecting the plurality of the write word lines.

3. The device of claim of claim 2, wherein the write column address generating means includes at least one first serial sequential shift register of a predetermined bit width, said at least one first serial sequential shift register (i) generating the write column address, (ii) resetting the write column address in response to a reset signal, (iii) generating a write master column address in response to a rising transition of the write clock signal and (iv) generating a write slave column address in response to a falling transition of the write clock signal.

4. The device of claim 2, wherein the write row address generating means includes at least one second serial sequential shift register of a predetermined bit width, the at least one second serial sequential shift register (i) generating the write row address, (ii) resetting the write row address in response to a reset signal, (iii) generating a write master row address in response to a rising transition of the write clock signal when a carrier is generated from the write column address generating means and (iv) generating a write slave row address and a next write row address in response to a falling transition of the write clock signal.

5. The device of claim 2, wherein the write column address generating means includes the predetermined number of first serial sequential shift registers of a predetermined bit width, each of the first serial sequential shift registers resetting the write column address in response to a reset signal, generating a write master column address in response to a rising transition of the write clock signal when a carrier is generated from the serial sequential shift register generating a least significant bit among the predetermined number of the first serial sequential shift registers, and generating a write slave column address and a next write slave column address in response to a falling transition of the write clock signal.

6. The device of claim 2, wherein the write row address generating means includes the predetermined number of second serial sequential shift registers of a predetermined bit, each of the second serial sequential shift registers resetting the write row address in response to a reset signal, generating a write master row address in response to a rising transition of the write clock signal when a carrier is generated from the serial sequential shift register generating a least significant among the write column address generating means and the predetermined number of the second serial sequential shift registers, and generating a write slave row address and a next write slave row address in response to a falling transition of the write clock signal.

7. The device of claim 1, wherein the read address generating means includes:

a read column address generating means generating a read column address for selecting the plurality of the read bit lines; and a read row address generating means generating a read row address for selecting the plurality of the read word lines.

8. The device of claim 7, wherein the read column address generating means includes at least one third serial sequential shift register of a predetermined bit width for generating the read column address, the third serial sequential shift register resetting the read column address in response to a reset signal, generating a read master column address in response to a rising transition of the read clock signal and generating a read slave column address in response to a falling transition of the read clock signal.

9. The device of claim 7, wherein the read row address generating means includes at least one fourth serial sequential shift register of a predetermined bit width generating the read row address, the fourth serial sequential shift register resetting the read row address in response to a reset signal, generating a read master row address in response to a rising transition of the read clock signal when a carrier is generated from the read column address generating means and generating a read slave row address and a next read row address in response to a falling transition of the read clock signal.

10. The device of claim 5, wherein the write column address generating means includes the predetermined number of third serial sequential shift registers of a predetermined bit width, each of the third serial sequential shift registers resetting the write column address in response to a reset signal, generating a write master column address in response to a rising transition of the write clock signal when a carrier is generated from the serial sequential shift register generating a least significant bit among the predetermined number of the first serial sequential shift registers, and generating a write slave column address and a next write slave column address in response to a falling transition of the write clock signal.

11. The device of claim 6, wherein the write row address generating means includes the predetermined number of fourth serial sequential shift registers of a predetermined bit width, each of the fourth serial sequential shift registers resetting the write row address in response to a reset signal, generating a write master row address in response to a rising transition of the write clock signal when a carrier is generated from the serial sequential shift register generating at least significant among the write column address generating means and the predetermined number of the second serial sequential shift registers, and generating a write slave row address and a next write slave row address in response to a falling transition of the write clock signal.

12. The device of claim 1, wherein the flag signal generating means includes:

a first comparison circuit comparing the next write address with a current read address to generate a first comparing coincidence signal when the next write address and the current read address are equal;

a first flip-flop receiving the first comparing coincidence signal in response to the write clock signal to generate the full flag signal;

a second comparison circuit comparing the current write address with a next read address to generate a second comparing coincidence signal when the current write address and the next read address are equal; and a second flip-flop receiving the second comparing coincidence signal in response to the read clock signal to generate the empty flag signal.

13. A method of generating a flag signal, comprising:

providing a FIFO memory device including a plurality of memory cells arranged between a plurality of write and read word lines and a plurality of write and read bit lines, the plurality of memory cells storing write data in response to a write address and outputting read data in response to a read address;

generating the write address in response to a write clock signal and the read address in response to a read clock signal; and comparing a next write address with a current read address to generate a full flag signal in response to the write clock signal when the next write address and the current read address are equal, and comparing a current write address with a next read address to generate an empty flag signal in response to the read clock signal when the current write address and the next read address are equal.

* * * * *